(12) United States Patent (10) Patent No.: US 12,191,426 B2
Huang et al. (45) Date of Patent: Jan. 7, 2025

(54) CHIP-ON-BOARD TYPE PHOTOELECTRIC DEVICE

(71) Applicant: KAISTAR Lighting (Xiamen) Co., Ltd., Xiamen (CN)

(72) Inventors: Debing Huang, Xiamen (CN); Zhikun Shen, Xiamen (CN); Yiqun Li, Danville, CA (US); Gang Wang, Xiamen (CN); Xianglong Yuan, Manteca, CA (US)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 441 days.

(21) Appl. No.: 17/585,608

(22) Filed: Jan. 27, 2022

(65) Prior Publication Data

US 2022/0254963 A1 Aug. 11, 2022

(30) Foreign Application Priority Data

Feb. 8, 2021 (CN) .......................... 202110172249.0

(51) Int. Cl.
*H01L 33/50* (2010.01)
*H01L 27/15* (2006.01)
*H01L 33/52* (2010.01)

(52) U.S. Cl.
CPC .......... *H01L 33/502* (2013.01); *H01L 27/156* (2013.01); *H01L 33/52* (2013.01)

(58) Field of Classification Search
CPC ..... H01L 33/502; H01L 27/156; H01L 33/52; H01L 25/0753; H01L 33/44; H01L 33/504; H01L 33/505; H01L 33/508; H01L 21/56
See application file for complete search history.

(56) References Cited

U.S. PATENT DOCUMENTS

| 2010/0181582 A1* | 7/2010 | Li | H01L 33/54 257/E33.056 |
| 2018/0371311 A1* | 12/2018 | Zhu | C09K 11/7786 |
| 2020/0058829 A1* | 2/2020 | Kim | H01L 33/504 |

FOREIGN PATENT DOCUMENTS

| CN | 108242442 A | 7/2018 |
| CN | 212062463 U | 12/2020 |
| CN | 212230457 U | 12/2020 |

* cited by examiner

*Primary Examiner* — Mohammad A Rahman

(74) *Attorney, Agent, or Firm* — Hemisphere Law, PLLC; Zhigang Ma

(57) ABSTRACT

A COB type photoelectric device is provided. The COB type photoelectric device includes: a metallic substrate including a photoelectric element fixing area; a dam disposed on the metallic substrate and surrounding the photoelectric element fixing area; first photoelectric elements disposed on the metallic substrate and in the photoelectric element fixing area; a KSF phosphor based layer disposed on the first photoelectric elements and being not in contact with the metallic substrate; and an isolation layer disposed in the dam and covering the KSF phosphor based layer. The KSF phosphor based layer includes a KSF phosphor. The COB type photoelectric device can make full use of high luminous efficiency performance of the KSF, and improve luminous efficiency of the COB type photoelectric device while maintaining stability of the KSF.

14 Claims, 7 Drawing Sheets

CHIP-ON-BOARD TYPE PHOTOELECTRIC DEVICE

FIELD OF THE DISCLOSURE

The disclosure relates to the field of photoelectric technologies, and more particularly to a chip-on-board (COB) type photoelectric device.

BACKGROUND OF THE DISCLOSURE

Nowadays, LED (light emitting diode) light sources are widely used in displays, lightings, advertising signs and other places due to their high brightness, low power consumption, long service life and simple installation. With the gradual maturity of LED light source technology, its application range is more extensive. At present, one of the mainstream LED light sources in the market is chip-on-board (COB) type light source. During the packaging and manufacturing of an existing COB type light source, a KSF (generally $K_2SiF_6:Me^{4+}$) phosphor will be added therein. The KSF phosphor has a relatively high luminous efficiency, and its application in the COB type light source can improve the luminous efficiency of the COB type light source. However, due to KSF material has strong metal corrosiveness, it will corrode metal structures such as a metal substrate and chip electrodes of the COB type light source. Moreover, it will also react with water and air, resulting in decomposition and poor stability.

Therefore, it is an urgent problem to provide a COB type light source that can improve the luminous efficiency while maintaining the stability of KSF and avoiding the KSF to corrode the metal.

SUMMARY OF THE DISCLOSURE

The disclosure discloses a COB type photoelectric device, which can make full use of high luminous efficiency performance of KSF, and improve the luminous efficiency of COB type light source while maintaining the stability of KSF.

Specifically, an embodiment of the disclosure provides a COB type photoelectric device. The COB type photoelectric device may include: a metallic substrate including a photoelectric element fixing area; a dam disposed on the metallic substrate and surrounding the photoelectric element fixing area; multiple (i.e., more than one) first photoelectric elements disposed on the metallic substrate and in the photoelectric element fixing area; a KSF phosphor based layer disposed on the multiple first photoelectric elements and being not in contact with the metallic substrate; and an isolation layer disposed in the dam and covering the KSF phosphor based layer. The KSF phosphor based layer includes a KSF phosphor.

In one embodiment of the disclosure, the KSF phosphor based layer may include multiple KSF phosphor based structures corresponding to the multiple first photoelectric elements in one by one manner, each of the multiple KSF phosphor based structures covers an upper surface of a corresponding one of the multiple first photoelectric elements facing away from the metallic substrate. Each of the multiple KSF phosphor based structures includes the KSF phosphor.

In one embodiment of the disclosure, a cross-section of any one of the multiple KSF phosphor based structures in a direction perpendicular to the metallic substrate is rectangular-shaped or dome-shaped.

In one embodiment of the disclosure, the KSF phosphor based layer may include multiple KSF phosphor based structures corresponding to the multiple first photoelectric elements in one by one manner, and each of the multiple KSF phosphor based structures covers an upper surface of a corresponding one of the multiple first photoelectric elements facing away from the metallic substrate and further extends from the upper surface to a side surface of the corresponding one first photoelectric element to thereby cover the side surface of the corresponding one first photoelectric element. The isolation layer is filled between each of the multiple KSF phosphor based structures and the metallic substrate.

In one embodiment of the disclosure, the isolation layer may include a first isolation layer disposed on the metallic substrate and a height of the first isolation layer in the direction perpendicular to the metallic substrate is not higher than a height of each of the multiple first photoelectric elements in the direction perpendicular to the metallic substrate, and a second isolation layer disposed over the KSF phosphor based layer.

In one embodiment of the disclosure, the KSF phosphor based layer may include multiple KSF phosphor based structures corresponding to the multiple first photoelectric elements in one by one manner, and each of the multiple KSF phosphor based structures covers an upper surface of a corresponding one of the multiple first photoelectric elements facing away from the metallic substrate. Each of the multiple KSF phosphor based structures includes the KSF phosphor. The second isolation layer is disposed over the first isolation layer and the multiple KSF phosphor based structures.

In one embodiment of the disclosure, the KSF phosphor based layer may include multiple KSF phosphor based structures corresponding to the multiple first photoelectric elements in one by one manner, and each of the multiple KSF phosphor based structures covers an upper surface of a corresponding one of the plurality of first photoelectric elements facing away from the metallic substrate and further extends from the upper surface to a side surface of the corresponding one first photoelectric element to thereby cover the side surface of the corresponding one first photoelectric element. Each of the multiple KSF phosphor based structures includes the KSF phosphor. The second isolation layer is disposed over the first isolation layer and the multiple KSF phosphor based structures.

In one embodiment of the disclosure, the height of the first isolation layer is the same as the height of each of the multiple first photoelectric elements, and the KSF phosphor based layer covers the first isolation layer and the multiple first photoelectric elements.

In one embodiment of the disclosure, the height of the first isolation layer is less than the height of each of the multiple first photoelectric elements, and the KSF phosphor based layer covers the first isolation layer and the multiple first photoelectric elements. A height of the KSF phosphor based layer covering the first isolation layer is greater than that of the KSF phosphor based layer covering the first photoelectric element, and an upper surface of the KSF phosphor based layer facing away from the metallic substrate is a horizontal plane.

In one embodiment of the disclosure, the COB type photoelectric element may further include multiple second photoelectric elements arranged on the metallic substrate and located in the photoelectric element fixing area. The multiple second photoelectric elements and the multiple first photoelectric elements are arranged in a predetermined manner. The isolation layer further covers the multiple second photoelectric elements and contains a phosphor other than the KSF phosphor. A color temperature of a light output by the phosphor contained in the isolation layer after wavelength conversion of light emitted from the multiple second photoelectric elements is higher than a color temperature of a light output by the KSF phosphor based layer after wavelength conversion of light emitted from the multiple first photoelectric elements.

In one embodiment of the disclosure, the COB type photoelectric element may further include multiple second photoelectric elements arranged on the metallic substrate and located in the photoelectric element fixing area. The multiple second photoelectric elements and the multiple first photoelectric elements are arranged in a predetermined manner. The first isolation layer is filled between each of the multiple first photoelectric elements and the second photoelectric element adjacent to the first photoelectric element; and in a direction perpendicular to the metallic substrate, the height of the first isolation layer is not higher than a height of the multiple second photoelectric elements. The second isolation layer is disposed over the first isolation layer and the multiple second photoelectric elements, and the second isolation layer contains a phosphor other than the KSF phosphor. A color temperature of light output by the phosphor contained in the second isolation layer after wavelength conversion of light emitted from the multiple second photoelectric elements is higher than a color temperature of light output by the KSF phosphor based layer after wavelength conversion of light emitted from the multiple first photoelectric elements.

Embodiments of the disclosure may have one or more of the following beneficial effects:

in the COB type photoelectric device described in the embodiments of the disclosure, the KSF phosphor based layer containing the KSF phosphor is disposed on the multiple first photoelectric elements, the KSF phosphor based layer is not in contact with (also referred to as spaced from) the metallic substrate, and the isolation layer is disposed on the KSF phosphor based layer, which can make full use of the high luminous efficiency performance of the KSF, and improve the luminous efficiency of COB type light source, and avoid the KSF to be in contact with water and air to cause a reaction and corrode the metallic substrate in the COB type light source to thereby maintain stability of the KSF. Further, the KSF phosphor based layer includes the multiple KSF phosphor based structures corresponding to the multiple first photoelectric elements in one by one manner, the KSF phosphor based structure covers the upper surface of the corresponding one first photoelectric element facing away from the metallic substrate and further extends from the upper surface to the side surface of the corresponding one first photoelectric element to cover the side surface of the corresponding one first photoelectric element, which can reduce the probability of blue light leakage. In addition, multiple second photoelectric elements are disposed in the photoelectric element fixing area, and the isolation layer contains the phosphor other than the KSF phosphor to cover the multiple second photoelectric elements, which can realize dimming and color adjustment functions of the COB type light source.

BRIEF DESCRIPTION OF DRAWINGS

In order to explain technical solutions of embodiments of the disclosure more clearly, the following will briefly introduce drawings needed to be used in the description of embodiments. Apparently, the drawings described in the following are only some of embodiments of the disclosure. For those skilled in the art, other drawings can be obtained according to these drawings without paying creative labor.

DETAILED DESCRIPTION OF EMBODIMENTS

The technical solutions of embodiments of the disclosure will be clearly and completely described below in combination with the accompanying drawings associated with the embodiments of the disclosure. Apparently, the illustrated embodiments are only some of embodiments of the disclosure, not all of embodiments of the disclosure. Based on the illustrated embodiments of the disclosure, all other embodiments obtained by those skilled in the art without creative labor should belong to the protection scope of the disclosure.

It should be noted that terms "first" and "second" in the description and claims of the disclosure and the above drawings are used to distinguish similar objects, and not necessarily used to describe a specific order or sequence. It should be understood that the terms used in this way can be interchanged under appropriate circumstances so that the embodiments of the disclosure described herein can be implemented in an order other than those illustrated or described herein. In addition, terms "include/comprise/contain" and "have" and any variations thereof are intended to cover non-exclusive inclusions. For example, a process, a method, a system, a product or an equipment that includes a series of steps or units is not necessarily limited to those steps or units clearly listed, but may include other step(s) or unit(s) that is/are not clearly listed or is/are inherent to the process, the method, the system, the product or the equipment.

First Embodiment

Figure 1:
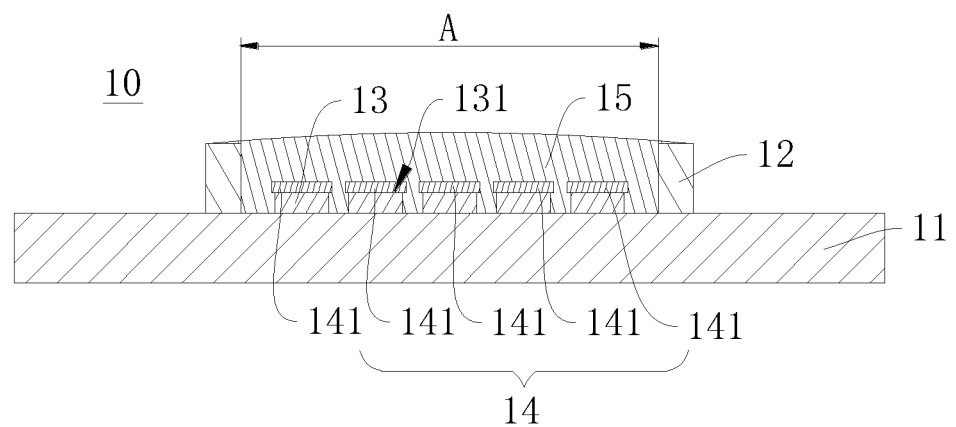
FIG. 1 is a schematic view of a partial structure of a COB type photoelectric device according to a first embodiment of the disclosure.

Referring to FIG. 1, the first embodiment of the disclosure provides a chip-on-board (COB) type photoelectric device. As shown in FIG. 1, the COB type photoelectric device 10 may include a metallic substrate 11, a dam 12 (also referred to as enclosure), multiple first photoelectric elements 13, a manganese-containing potassium fluorosilicate (hereinafter shorted as KSF) phosphor based layer 14, and an isolation layer 15.

The metallic substrate 11 may include a photoelectric element fixing area A. The dam 12 is disposed on the metallic substrate 11 and surrounding the photoelectric element fixing area A. The multiple first photoelectric elements 13 are disposed on the metallic substrate 11 and in the photoelectric element fixing area A. The KSF phosphor based layer 14 is disposed on the multiple first photoelectric elements 13 and being not in contact with (also referred to as spaced from) the metallic substrate 11. The KSF phosphor based layer 14 includes a KSF phosphor, generally $K_2SiF_6$:$Mn^{4+}$ phosphor. The isolation layer 15 is disposed in the dam 12 and covering the KSF phosphor based layer 14.

As shown in FIG. 1, the KSF phosphor based layer 14 may include multiple KSF phosphor based structures 141 corresponding to the multiple first photoelectric elements 13 in one by one manner. Each the KSF phosphor based structure 141 covers an upper surface 131 of the corresponding one first photoelectric element 13 facing away from the metallic substrate 11. Each the KSF phosphor based structure 141 includes the KSF phosphor. FIG. 1 illustrates five first photoelectric elements 13 and five corresponding KSF phosphor based structures 141, but the disclosure is not limited thereto.

Specifically, the metallic substrate 11 is for example an aluminum substrate. The aluminum substrate has good thermal conductivity, is not fragile and has good mechanical durability. The photoelectric element fixing area A can also be referred to as a bonding area, that is, a mounting area of the photoelectric elements. The illustrated embodiment does not limit the specific shape of the metallic substrate 11, which can be square-shaped, circular-shaped and other shape. In addition, it is indicated that the metallic substrate 11 can also be a ceramic substrate provided with a metal circuit.

The dam 12 is a closed ring-shaped structure, which is made of for example a white dam glue, and a height of the dam 12 can be set according to actual situations.

The first photoelectric element 13 is for example a lateral-chip type photoelectric element or a flip-chip type photoelectric element. When the first photoelectric element 13 is the flip-chip type photoelectric element, since metal parts of the flip-chip type photoelectric element such as electrodes are located on a side close to the metallic substrate and there is no metal part on another side facing away from the metallic substrate, and therefore the KSF phosphor based structure 141 covers the upper surface of the corresponding first photoelectric element 13 facing away from the metallic substrate 11, so that the KSF phosphor based structure 141 is not in contact with the metal parts of the flip-chip type photoelectric element, thereby avoiding the corrosion of the KSF phosphor in the KSF phosphor based structure 141 to the metal parts of the flip-chip type photoelectric element. In addition, when the first photoelectric element 13 is the lateral-chip type photoelectric element, since metal parts of the lateral-chip type photoelectric element such as electrodes are located on a side facing away from the metallic substrate, during an application of the lateral-chip type photoelectric element, the metal parts of the lateral-chip type photoelectric element need to be pretreated, such as applying a coating layer on the metal parts for isolation, and therefore the metal parts of the lateral-chip type photoelectric element is prevented from being in contact with the KSF phosphor of the KSF phosphor based structure 141 and being corroded by the KSF phosphor of the KSF phosphor based structure 141. The illustrated embodiment does not limit the specific type and quantity/amount of the first photoelectric elements 13, and they can be set according to actual needs.

In addition, it is worth mentioning that the COB type photoelectric device 10 may further include a first positive electrode and a first negative electrode (not shown in FIG. 1) connected with the multiple first photoelectric elements 13. The first positive electrode and the first negative electrode may be a resin-based circuit layer, such as a BT (Bismaleimide Triazine) resin-based circuit layer, which are disposed on a side of the dam 12 facing away from the photoelectric element fixing area A. The multiple first photoelectric elements 13 are for example multiple light-emitting diode (LED) chips. The multiple light-emitting diode chips are electrically connected with the first positive electrode and the first negative electrode in series, in a parallel, or in a series-parallel hybrid mode. The light-emitting diode chip is for example a blue light-emitting diode chip or a purple light-emitting diode chip.

The KSF phosphor based structure 141 is for example a phosphor glue, that is, it includes a KSF phosphor and a transparent glue material. The transparent glue material is for example epoxy resin, silicone, methyl silicone resin, phenyl silicone resin, methyl phenyl silicone resin, or modified silicone resin. Alternatively, the KSF phosphor based structure 141 is for example a phosphor glue hard layer, that is, which includes a KSF phosphor, a transparent glue material, and a hard transparent material such as glass. After the KSF phosphor and the transparent glue material form a phosphor glue layer, the formed phosphor glue layer is coated on the hard transparent material such as glass to form the KSF phosphor based structure 141. Alternatively, the KSF phosphor based structure 141 is for example a phosphor layer, that is, it includes a KSF phosphor and a hard transparent material such as glass, for example it is a glass sheet carrying the KSF phosphor, a ceramic sheet carrying the KSF phosphor, or an adhesive film carrying the KSF phosphor. In some embodiments, besides the KSF phosphor, the KSF phosphor based structure 141 may include a phosphor of other color, that is, the KSF phosphor based structure 141 may contain only one type of phosphor, or contain multiple types of phosphors (i.e., a mixture of phosphors of multiple colors including the KSF phosphor). In the illustrated embodiment, the multiple KSF phosphor based structures 141 constitute the KSF phosphor based layer 14.

The isolation layer 15 is for example another phosphor glue composed of a phosphor other than the KSF phosphor and a transparent glue material. The phosphor other than the KSF phosphor can be a monochromatic phosphor or a mixed-color phosphor. The monochromatic phosphor is for example yellow phosphor or green phosphor, and the mixed-color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin. The isolation layer 15 is filled in the whole area closed by the dam 12, that is, the isolation layer 15 is filled around the multiple first photoelectric elements 13 and the KSF phosphor based layer 14. The illustrated embodiment does not limit the type of the phosphor contained in the isolation layer 15, and it can be set according to actual needs, that is, for example, the KSF phosphor in the KSF phosphor based layer forms/outputs red light after wavelength conversion of a part of light emitted from the first photoelectric element 13, the phosphor contained in the isolation layer 15 outputs other color of light after wavelength conversion of another part of light emitted from by the first photoelectric element 13 that passes through the KSF phosphor based layer, and the outputted two colors of light are mixed to produce light at a desired color temperature. Of course, the illustrated embodiment does not limit that the isolation layer 15 must contain the phosphor therein, and the isolation layer 15 can be for example a transparent glue or a white diffusion glue containing diffusion powders instead. It can be understood herein that the KSF phosphor based structure 141 may contain not only the KSF phosphor but also other phosphor, that is, the KSF phosphor in the KSF phosphor based structure 141 outputs red light after wavelength conversion of a part of light emitted from the first photoelectric element 13, the other phosphor in the KSF phosphor based structure 141 outputs other color of light after wavelength conversion of light emitted from the first photoelectric element 13, the outputted two colors of light are mixed to produce light at a desired color temperature, and the isolation layer 15 only needs to transmit the light, or diffuse and then transmit the light.

As shown in FIG. 1, cross-sections of the multiple KSF phosphor based structures 141 in a direction perpendicular to the metallic substrate 11 each are for example rectangular-shaped. That is, the multiple KSF phosphor based structures 141 cover the upper surfaces of the multiple first photoelectric elements 13 with equal thicknesses. An implementation form of the COB type photoelectric device 10 shown in FIG. 1 may include: fixing the multiple first photoelectric elements 13 on the metallic substrate 11, then attaching the multiple KSF phosphor based structures 141 on the upper surfaces of the multiple first photoelectric elements 13 respectively, the KSF phosphor based structure 141 being for example a glass sheet carrying the KSF phosphor, a ceramic sheet carrying the KSF phosphor or an adhesive film carrying the KSF phosphor, and finally filling the isolation layer 15 on surfaces of the multiple KSF phosphor based structures 141 and the multiple first photoelectric elements 13 and around the multiple KSF phosphor based structures 141 and the multiple first photoelectric elements 13.

Figure 2:
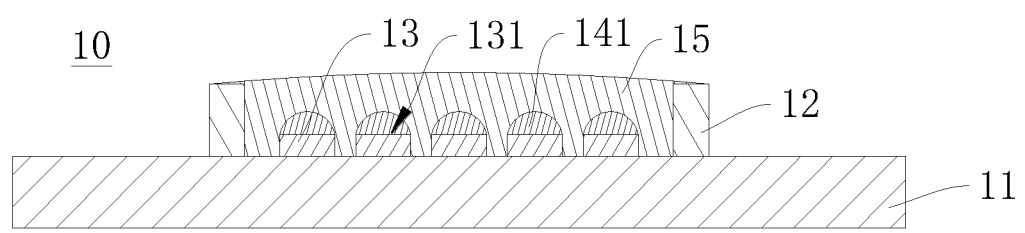
FIG. 2 is a schematic view of a partial structure of another COB type photoelectric device according to the first embodiment of the disclosure.

It should be noted that the disclosure is not limited to the illustration of FIG. 1. Referring to FIG. 2, the cross-sections of the multiple KSF phosphor based structures 141 in the direction perpendicular to the metallic substrate 11 may be dome-shaped, such as semicircular-shaped instead. An implementation form of the COB type photoelectric device 10 shown in FIG. 2 may include: fixing/mounting the multiple first photoelectric elements 13 on the metallic substrate 11, then dispensing a glue on the upper surface of each first photoelectric element 13 to form the KSF phosphor based structure 141, the KSF phosphor based structure 141 being a phosphor glue containing the KSF phosphor, and finally filling the isolation layer 15 on surfaces of the multiple KSF phosphor based structures 141 and the multiple first photoelectric elements 13 and around the multiple KSF phosphor based structures 141 and the multiple first photoelectric elements 13.

In summary, for the COB type photoelectric device described in the first embodiment of the disclosure, the multiple KSF phosphor based structures containing the KSF phosphor are disposed on the multiple first photoelectric elements respectively, and are not in contact with the metallic substrate, the isolation layer is disposed covering the multiple KSF phosphor based structures, which can make full use of the high luminous efficiency performance of KSF, and improve the luminous efficiency of COB type light source while avoiding the KSF to be in contact with water and air to cause a reaction and to corrode the metallic substrate in the COB type light source to thereby maintain stability of the KSF.

Second Embodiment

Figure 3:
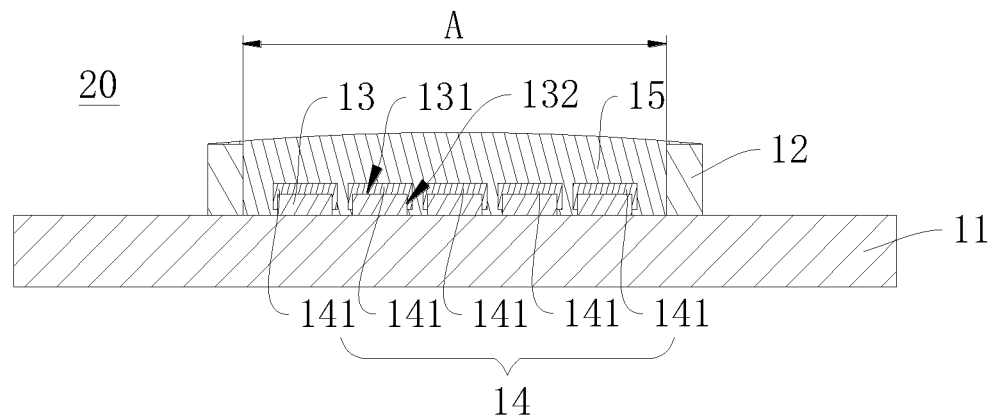
FIG. 3 is a schematic view of a partial structure of a COB type photoelectric device according to a second embodiment of the disclosure.

Referring to FIG. 3, the second embodiment of the disclosure provides a COB type photoelectric device. As shown in FIG. 3, the COB photoelectric device 20 may include a metallic substrate 11, a dam 12, multiple first photoelectric elements 13, a KSF phosphor based layer 14, and an isolation layer 15.

The metallic substrate 11 may include a photoelectric element fixing area A. The dam 12 is disposed on the metallic substrate 11 and surrounding the photoelectric element fixing area A. The multiple first photoelectric elements 13 are disposed on the metallic substrate 11 and are located in the photoelectric element fixing area A. The KSF phosphor based layer 14 is disposed on the multiple first photoelectric elements 13 and being not in contact the metallic substrate 11. The KSF phosphor based layer 14 includes a KSF phosphor. The isolation layer 15 is disposed in the dam 12 and covering the KSF phosphor based layer 14.

The KSF phosphor based layer 14 may include multiple KSF phosphor based structures 141 corresponding to the multiple first photoelectric elements 13 in one by one manner.

The difference between the COB type photoelectric device 20 provided in the illustrated embodiment and the COB type photoelectric device 10 provided in the first embodiment is that in the COB type photoelectric device 20 provided in the illustrated embodiment, each KSF phosphor based structure 141 covers the upper surface 131 of a corresponding one of the multiple first photoelectric elements 13s facing away from the metallic substrate 11 and further extends from the upper surface 131 to the side surface 132 of the corresponding one first photoelectric element 13 to thereby cover the side surface 132 of the corresponding one first photoelectric element 13.

Specifically, the length of each of the multiple KSF phosphor based structures 141 extending from the upper surface 131 to the side surface 132 of each of the multiple first photoelectric elements 13 is less than the height of each of the multiple first photoelectric elements 13, that is, it is ensured that the KSF phosphor based structure 141 will be not in contact with the metallic substrate 11. The isolation layer 15 is filled between each of the multiple KSF phosphor based structures 141 and the metallic substrate 11.

As shown in FIG. 3, the multiple KSF phosphor based structures 141 may cover the upper surfaces 131 of the multiple first photoelectric elements 13 with equal thicknesses and the side surfaces 132 of the multiple first photoelectric elements 13 with equal thicknesses. The thickness of each of the multiple KSF phosphor based structures 141 on the upper surface of each of the multiple first photoelectric elements 13 and the thickness on the side surface of each of the multiple first photoelectric elements 13 are the same or different. An implementation form of the COB type photoelectric device 20 shown in FIG. 3 may include: coating the KSF phosphor based structure 141 on the upper surface 131 and four side surfaces 132 of each of the multiple first photoelectric elements 13 to form chip scale package (CSP) structures, the length of each of the multiple KSF phosphor based structures 141 on the four side surfaces 132 being less than the height of each of the multiple first photoelectric elements 13, fixing the CSP structure on the metallic substrate 11, and finally filling the isolation layer 15 on the surfaces of the CSP structures and around the CSP structures.

Figure 4:
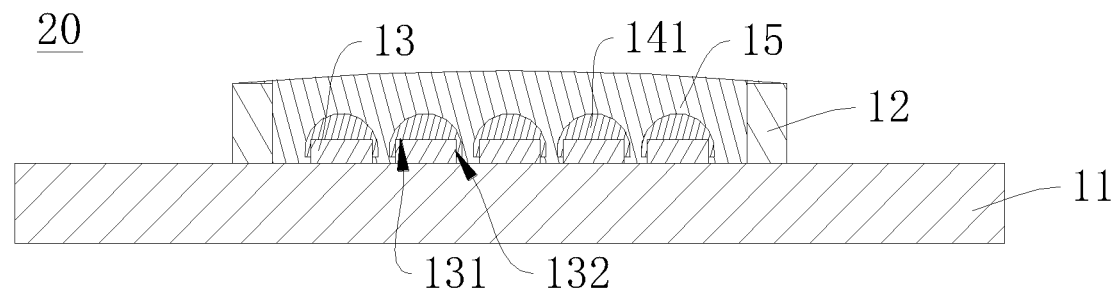
FIG. 4 is a schematic view of a partial structure of another COB type photoelectric device according to the second embodiment of the disclosure.

It should be noted that the disclosure is not limited to the illustration of FIG. 3. In some embodiments, the multiple KSF phosphor based structures 141 cover the upper surfaces 131 of the multiple first photoelectric elements 13 with unequal thicknesses and the side surfaces 132 of the multiple first photoelectric elements 13 with unequal thicknesses. Referring to FIG. 4, cross-sections of the multiple KSF phosphor based structures 141 in the direction perpendicular to the metallic substrate 11 may be dome-shaped, such as semicircular-shaped instead. An implementation form of the COB type photoelectric device 20 shown in FIG. 4 may include: coating the KSF phosphor based structure 14 on the upper surface 131 and four side surfaces 132 of each of the multiple first photoelectric elements 13 by injection molding to obtain pre-molded parts, the length of each of the multiple KSF phosphor based structures 14 on the four side surfaces 132 being not greater than the height of each of the multiple first photoelectric elements 13, then fixing the pre-molded part on the metallic substrate 11, and finally filling the isolation layer 15 on the surfaces of the pre-molded parts and around the pre-molded parts.

In summary, the COB type photoelectric device described in the second embodiment of the disclosure, the multiple KSF phosphor based structures containing the KSF phosphor are disposed on the multiple first photoelectric elements respectively, and are not in contact with the metallic substrate, the isolation layer is disposed covering on the multiple KSF phosphor based structures, which can make full use of the high luminous efficiency performance of KSF, and improve the luminous efficiency of COB type light source while avoiding the KSF to be in contact with water and air to cause a reaction and to corrode the metallic substrate in the COB type light source to thereby maintain stability of the KSF. In addition, the KSF phosphor based structure covers the upper surface of the corresponding one first photoelectric element facing away from the metallic substrate and further extends from the upper surface to the side surface of the corresponding one first photoelectric element to thereby cover the side surface of the corresponding one first photoelectric element, which can reduce the probability of blue light leakage.

Third Embodiment

Figure 5:
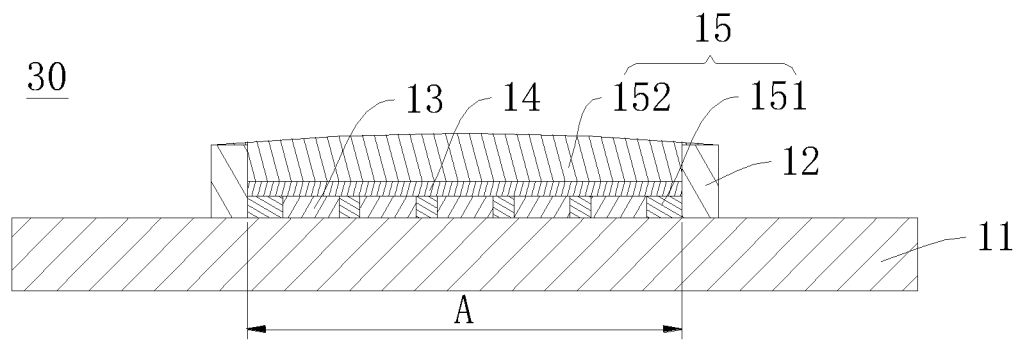
FIG. 5 is a schematic view of a partial structure of a COB type photoelectric device according to a third embodiment of the disclosure.

Referring to FIG. 5, the third embodiment of the disclosure provides a COB type photoelectric device. As shown in FIG. 5, the COB type photoelectric device 30 may include a metallic substrate 11, a dam 12, multiple first photoelectric elements 13, a KSF phosphor based layer 14 and an isolation layer 15.

The metallic substrate 11 may include a photoelectric element fixing area A. The dam 12 is disposed on the metallic substrate 11 and surrounding the photoelectric element fixing area A. The multiple first photoelectric elements 13 are disposed on the metallic substrate 11 and in the photoelectric element fixing area A. The KSF phosphor based layer 14 is disposed on the multiple first photoelectric elements 13 and being not in contact with the metallic substrate 11. The KSF phosphor based layer 14 includes a KSF phosphor. The isolation layer 15 is disposed in the dam 12 and covering the KSF phosphor based layer 14.

As shown in FIG. 5, the isolation layer 15 may include a first isolation layer 151 and a second isolation layer 152. The first isolation layer 151 is disposed on the metallic substrate 11 and filled between two adjacent first photoelectric elements 13, and a height of the first isolation layer 151 is greater than 0 and not greater than a height of each of the multiple first photoelectric elements 13 in a direction perpendicular to the metallic substrate 11. The KSF phosphor based layer 14 is disposed on the first isolation layer 151 and the multiple first photoelectric elements 13 to cover the first isolation layer 151 and the multiple first photoelectric elements 13. The second isolation layer 152 is disposed over the KSF phosphor based layer 14.

Specifically, the metallic substrate 11 is for example an aluminum substrate. The aluminum substrate has good thermal conductivity, is not fragile and has good mechanical durability. The photoelectric element fixing area A can also be referred to as a bonding area, that is, a mounting area of the photoelectric elements. The illustrated embodiment does not limit the specific shape of the metallic substrate 11, which can be square-shaped, circular-shaped and other shape. In addition, it is indicated that the metallic substrate 11 can also be a ceramic substrate provided with a metal circuit.

The dam 12 is a closed ring-shaped structure, which is made of for example a white dam glue, and the height of dam 12 can be set according to actual situations.

The first photoelectric element 13 is for example a lateral-chip type photoelectric element or a flip-chip type photoelectric element. When the first photoelectric element 13 is the flip-chip type photoelectric element, since metal parts of the flip-chip type photoelectric element such as electrodes are located on the side close to the metallic substrate and there is no metal part on the side facing away from the metallic substrate, and therefore the KSF phosphor based layer 14 covers the upper surface of the corresponding first photoelectric element 13 facing away from the metallic substrate 11, so that the KSF phosphor based layer 14 is not in contact with the metal parts of the flip-chip type photoelectric element, thereby avoiding the corrosion of the KSF phosphor in the KSF phosphor based layer 14 to the metal parts of the flip-chip type photoelectric element. In addition, when the first photoelectric element 13 is the lateral-chip type photoelectric element, since the metal parts of the lateral-chip type photoelectric element such as electrodes are located on a side facing away from the metallic substrate, during an application of the lateral-chip type photoelectric element, the metal parts of the lateral-chip type photoelectric element need to be pretreated, such as applying a coating layer on the metal parts for isolation, and therefore the metal parts of the lateral-chip type photoelectric element is prevented from being in contact with the KSF phosphor of the KSF phosphor based structure 141 and being corroded by the KSF phosphor of the KSF phosphor based structure 141. The illustrated embodiment does not limit the specific type and quantity of the first photoelectric elements 13, and they can be set according to actual needs.

In addition, it is worth mentioning that the COB type photoelectric device 30 may further include a first positive electrode and a first negative electrode (not shown in FIG. 6), connected with the multiple first photoelectric elements 13. The first positive electrode and the first negative electrode may be resin-based circuit layers, such as BT (Bismaleimide Triazine) resin-based circuit layer. The multiple first photoelectric elements 13 are for example multiple light-emitting diode chips, and the multiple light-emitting diode chips are electrically connected with the first positive electrode and the first negative electrode in a series, in a parallel or in a series-parallel hybrid mode. The light-emitting diode chip is for example a blue light-emitting diode chip or a purple light-emitting diode chip.

The KSF phosphor based layer 14 is an integral layer structure, which is for example a phosphor glue layer, that is, it includes the a KSF phosphor and a transparent glue material. The transparent glue material is for example epoxy resin, silicone, methyl silicone resin, phenyl silicone resin, methyl phenyl silicone resin or modified silicone resin. Alternatively, the KSF phosphor based layer 14 is for example a phosphor glue hard layer, that is, which includes a KSF phosphor, a transparent glue material, and a hard transparent material such as glass. After the KSF phosphor and the transparent glue material form a phosphor glue layer, the formed phosphor glue layer is coated on the hard transparent material such as glass to form the KSF phosphor based layer 14. Alternatively, the KSF phosphor based layer 14 is for example a phosphor layer, that is, it includes a KSF phosphor and a hard transparent material such as glass, for example it is a glass sheet carrying the KSF phosphor, a ceramic sheet carrying the KSF phosphor, or an adhesive film carrying the KSF phosphor. In some embodiments, besides the KSF phosphor, KSF phosphor based layer 14 may include a phosphor of other color, that is, the KSF phosphor based layer 14 may contain only one type of phosphor, or contain multiple types of phosphors (i.e., a mixture of phosphors of multiple colors including the KSF phosphor).

The first isolation layer 151 is for example a transparent isolation layer, including a transparent silicone. Alternatively, the first isolation layer 151 is for example a reflective layer, including a white reflective glue. Alternatively, the first isolation layer 151 is for example a phosphor glue layer, including a phosphor other than the KSF phosphor and a transparent glue material. The phosphor other than the KSF phosphor can be a monochrome phosphor or a mixed color phosphor. The monochrome phosphor is for example yellow phosphor or green phosphor, and the mixed color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin. Alternatively, the first isolation layer 151 is for example a substrate protective layer, which is generated by pretreatment of the metallic substrate, such as spraying protective paint, etc.

The second isolation layer 152 is for example a phosphor glue layer, including a phosphor other than the KSF phosphor and a transparent glue material. The phosphor other than the KSF phosphor can be a monochromatic phosphor or a mixed color phosphor. The monochromatic phosphor is for example yellow phosphor or green phosphor, and the mixed color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin. When the first isolation layer 151 is also a phosphor glue layer, the phosphor contained in the second isolation layer 152 may or may not be the same as the phosphor contained in the first isolation layer 151. The illustrated embodiment does not limit the material of the first isolation layer 151 and the types of other phosphor contained in the second isolation layer 152, which can be set according to actual needs. Of course, the illustrated embodiment does not limit that the second isolation layer 152 must contain phosphor. When the KSF phosphor based layer 14 contains not only the KSF phosphor but also other phosphor, the second isolation layer 152 may also be a transparent glue or a white diffusion glue containing diffusion powder.

Figure 6:
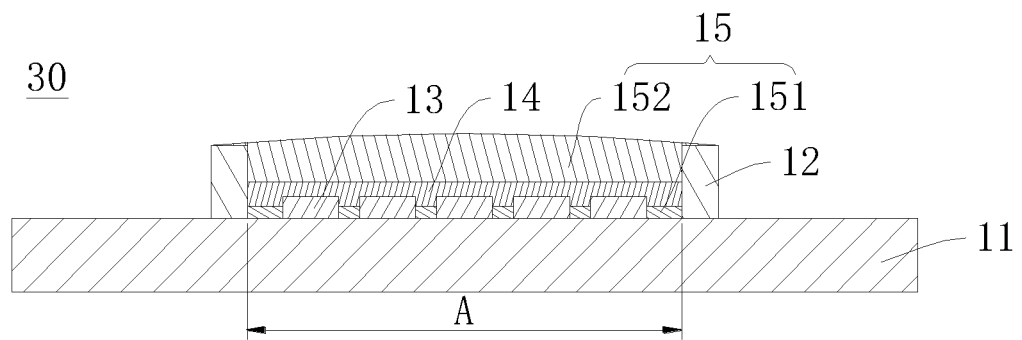
FIG. 6 is a schematic view of a partial structure of another COB type photoelectric device according to the third embodiment of the disclosure.

As shown in FIG. 5, the height of the first isolation layer 151 is the same as the height of each of the multiple first photoelectric elements 13, and the KSF phosphor based layer 14 covers the first isolation layer 151 and the multiple first photoelectric elements 13. Specifically, the KSF phosphor based layer 14 is disposed on the first isolation layer 151 and the multiple first photoelectric elements 13 at the same height. Of course, the embodiment of the disclosure is not limited to this. Referring to FIG. 6, the height of the first isolation layer 151 is greater than 0 and less than the height of each of the multiple first photoelectric elements 13, the KSF phosphor based layer 14 covers the first isolation layer 151 and the multiple first photoelectric elements 13, and a height of the KSF phosphor based layer 14 covering the first isolation layer 151 is greater than the height of the KSF phosphor based layer 14 covering the first photoelectric element 13. Further, the upper surface of the KSF phosphor based layer 14 facing away from the metallic substrate 11 is a horizontal plane.

An implementation form of the COB type photoelectric device 30 shown in FIG. 5 may include: fixing the multiple first photoelectric elements 13 on the photoelectric element fixing area A of the metallic substrate 11, covering the first isolation layer 151 on the metallic substrate 11, and the height of the first isolation layer 151 being the same as that of the first photoelectric element 13, attaching a glass sheet carrying the KSF phosphor, a ceramic sheet carrying the KSF phosphor or an adhesive film carrying the KSF phosphor on the multiple first photoelectric elements 13 and the first isolation layer 151 respectively as the KSF phosphor based layer 14, or tiling a layer of phosphor glue containing the KSF phosphor as the KSF phosphor based layer 14, and then filling the second isolation layer 152 over the KSF phosphor based layer 14. An implementation form of the COB type photoelectric device 30 shown in FIG. 6 may include: fixing the multiple first photoelectric elements 13 on the photoelectric element fixing area A of the metallic substrate 11, covering the first isolation layer 151 on the metallic substrate 11, and the height of the first isolation layer 151 being less than that of the first photoelectric element 13, filling a layer of phosphor glue containing the KSF phosphor on the first isolation layer 151 and the surfaces and surroundings of the multiple first photoelectric elements 13 as the KSF phosphor based layer 14, and then filling the second isolation layer 152 over the KSF phosphor based layer 14.

In summary, the COB type photoelectric device described in the third embodiment of the disclosure, the first isolation layer is disposed on the metallic substrate, the KSF phosphor based layer containing the KSF phosphor is disposed on the multiple first photoelectric elements and the first isolation layer, the KSF phosphor based layer is not in contact with the metallic substrate, and the second isolation layer is disposed on the KSF phosphor based layer and the first isolation layer, which can make full use of the high luminous efficiency performance of KSF, and improve the luminous efficiency of COB type light source while avoiding the KSF to be in contact with water and air to cause a reaction and to corrode the metallic substrate in the COB type light source to thereby maintain stability of the KSF.

Fourth Embodiment

Figure 7:
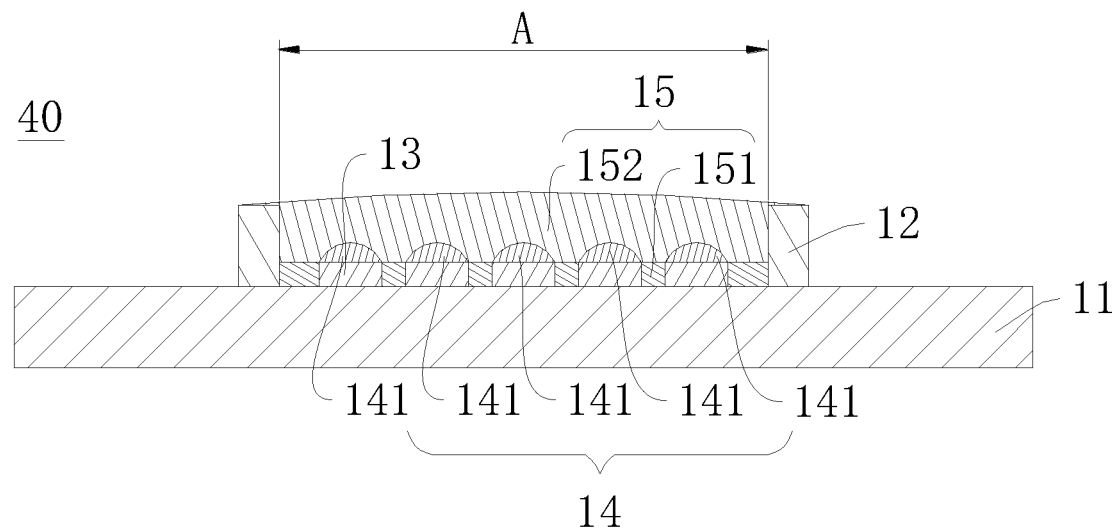
FIG. 7 is a schematic view of a partial structure of a COB type photoelectric device according to a fourth embodiment of the disclosure.

Referring to FIG. 7, the fourth embodiment of the disclosure provides a COB type photoelectric device. As shown in FIG. 7, the COB type photoelectric device 40 may include a metallic substrate 11, a dam 12, multiple first photoelectric elements 13, a KSF phosphor based layer 14 and an isolation layer 15.

The metallic substrate 11 may include a photoelectric element fixing area A. The dam 12 is disposed on the metallic substrate 11 and surrounding the photoelectric element fixing area A. The multiple first photoelectric elements 13 are disposed on the metallic substrate 11 and in the photoelectric element fixing area A. The KSF phosphor based layer 14 is disposed on the multiple first photoelectric elements 13 and being not in contact with the metallic substrate 11. The KSF phosphor based layer 14 includes a KSF phosphor. The isolation layer 15 is disposed in the dam 12 and covering the KSF phosphor based layer 14.

As shown in FIG. 7, the KSF phosphor based layer 14 may include multiple KSF phosphor based structures 141 corresponding to the multiple first photoelectric elements 13 in one by one manner. Each the KSF phosphor based structure 141 covers the upper surface of the corresponding one of the multiple first photoelectric elements 13 facing away from the metallic substrate 11, and each the KSF phosphor based structure 141 includes the KSF phosphor. FIG. 7 illustrates five first photoelectric elements 13 and five corresponding KSF phosphor based structures 141, but the disclosure is not limited thereto.

The difference between the COB type photoelectric device 40 described in the illustrated embodiment and the COB type photoelectric device 10 described in the first embodiment is that in the COB type photoelectric device 40 described in the illustrated embodiment, the isolation layer 15 may include a first isolation layer 151 and a second isolation layer 152. The first isolation layer 151 is disposed on the metallic substrate 11 and filled between two adjacent first photoelectric elements 13, and the height of the first isolation layer 151 is not higher than the height of each of the multiple first photoelectric elements 13 in the direction perpendicular to the metallic substrate 11. The second isolation layer 152 is disposed over the first isolation layer 151 and the multiple KSF phosphor based structures 141. The height of the first isolation layer 151 shown in FIG. 7 is the same as the height of each of the multiple first photoelectric elements 13, but the illustrated embodiment is not limited thereto. In some embodiments, the height of the first isolation layer 151 may also be less than the height of each of the multiple first photoelectric elements 13.

The first isolation layer 151 is for example a transparent isolation layer, including transparent silicone. Alternatively, the first isolation layer 151 is for example a reflective layer, including a white reflective glue. Alternatively, the first isolation layer 151 is for example a phosphor glue layer, including a phosphor other than the KSF phosphor and a transparent glue material. The phosphor other than the KSF phosphor can be a monochrome phosphor or a mixed color phosphor. The monochrome phosphor is for example yellow phosphor or green phosphor, and the mixed color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin. Alternatively, the first isolation layer 151 is for example a substrate protective layer, which is generated by pretreatment of the metallic substrate, such as spraying protective paint, etc.

The second isolation layer 152 is for example a phosphor glue layer, including a phosphor other than the KSF phosphor and a transparent glue material. The phosphor other than the KSF phosphor can be a monochromatic phosphor or a mixed color phosphor. The monochromatic phosphor is for example yellow phosphor or green phosphor, and the mixed color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin. When the first isolation layer 151 is also a phosphor glue layer, the phosphor contained in the second isolation layer 152 may or may not be the same as the phosphor contained in the first isolation layer 151. The illustrated embodiment does not limit the material of the first isolation layer 151 and the types of other phosphor contained in the second isolation layer 152, which can be set according to actual needs. Of course, the illustrated embodiment does not limit that the second isolation layer 152 must contain phosphor. When the KSF phosphor based structure 141 contains not only the KSF phosphor but also other phosphor, the second isolation layer 152 may also be a transparent glue or a white diffusion glue containing diffusion powder.

As shown in FIG. 7, cross-sections of the multiple KSF phosphor based structures 141 in the direction perpendicular to the metallic substrate 11 each are dome-shaped, such as semicircular-shaped instead. An implementation form of the COB type photoelectric device 40 shown in FIG. 7 may include: fixing the multiple first photoelectric elements 13 on the photoelectric element fixing area A of the metallic substrate 11, covering the first isolation layer 151 on the metallic substrate 11, and the height of the first isolation layer 151 being greater than 0 and not greater than the height of each of the multiple first photoelectric elements 13, then dispensing a phosphor glue containing the KSF phosphor on the upper surface of each of the multiple first photoelectric elements 13 to thereby form the KSF phosphor based structure 141, and finally filling the second isolation layer 152 on the surfaces of the multiple KSF phosphor based structures 141 and the first isolation layer 151 and around the multiple KSF phosphor based structures 141 and the first isolation layer 151.

Figure 8:
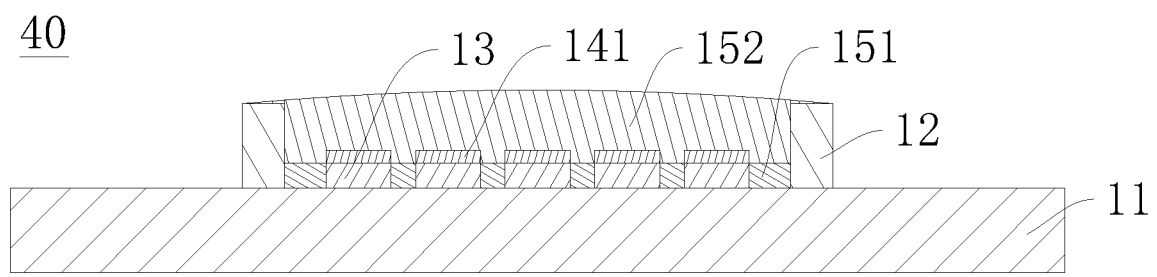
FIG. 8 is a schematic view of a partial structure of another COB type photoelectric device according to the fourth embodiment of the disclosure.

Further, in other embodiments of the disclosure, as shown in FIG. 8, the cross-sections of the multiple KSF phosphor based structures 141 in the direction perpendicular to the metallic substrate 11 each are for example rectangular-shaped. That is, the multiple KSF phosphor based structures 141 cover the upper surfaces of the multiple first photoelectric elements 13 with equal thicknesses. An implementation form of the COB type photoelectric device 40 shown in FIG. 8 may include: fixing the multiple first photoelectric elements 13 on the photoelectric element fixing area A of the metallic substrate 11, covering the first isolation layer 151 on the metallic substrate 11, and the height of the first isolation layer 151 being greater than 0 and not greater than the height of each of the multiple first photoelectric elements 13, attaching a glass sheet carrying the KSF phosphor, a ceramic sheet carrying the KSF phosphor or an adhesive film carrying the KSF phosphor on the upper surfaces of the multiple first photoelectric elements 13 respectively to thereby form the multiple KSF phosphor based structures 141, and finally filling the second isolation layer 152 on the surfaces of the multiple KSF phosphor based structures 141 and the first isolation layer 151 and around the multiple KSF phosphor based structures 141 and the first isolation layer 151.

In summary, the COB type photoelectric device described in the fourth embodiment of the disclosure, the first isolation layer is disposed on the metallic substrate, the KSF phosphor based structure containing the KSF phosphor is disposed on the multiple first photoelectric elements, and the second isolation layer is disposed covering the KSF phosphor based structure and the first isolation layer, which can make full use of the high luminous efficiency performance of KSF, and improve the luminous efficiency of COB type light source while avoiding the KSF in contact with water and air to cause a reaction and to corrode the metallic substrate in COB type light source to thereby maintain stability of the KSF.

Fifth Embodiment

Figure 9:
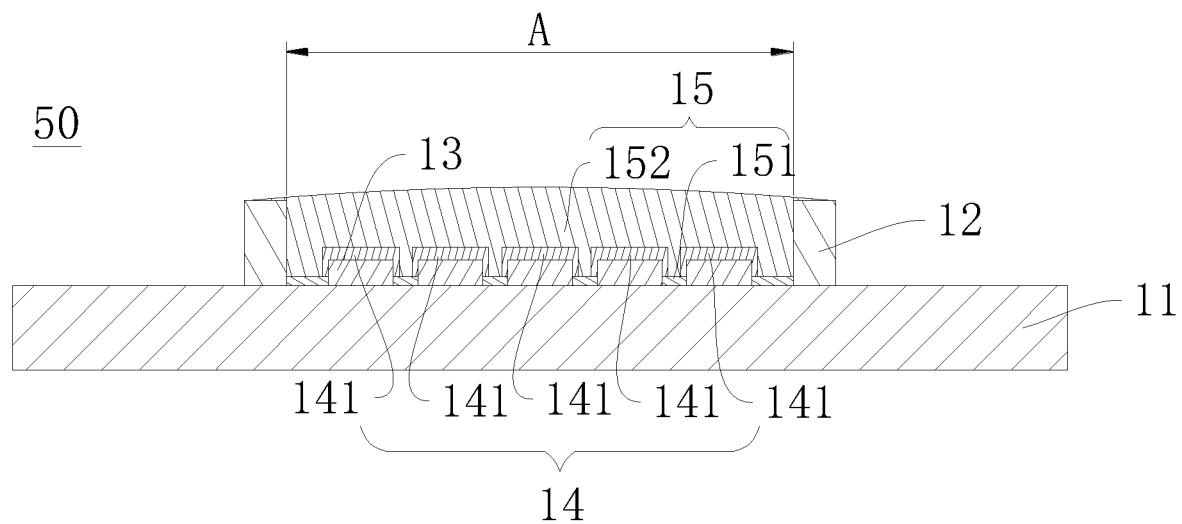
FIG. 9 is a schematic view of a partial structure of a COB type photoelectric device according to a fifth embodiment of the disclosure.

Referring to FIG. 9, the fifth embodiment of the disclosure provides a COB type photoelectric device. As shown in FIG. 9, the COB type photoelectric device 50 may include a metallic substrate 11, a dam 12, multiple first photoelectric elements 13, a KSF phosphor based layer 14 and an isolation layer 15.

The metallic substrate 11 may include a photoelectric element fixing area A. The dam 12 is disposed on the metallic substrate 11 and surrounding the photoelectric element fixing area A. The multiple first photoelectric elements 13 are disposed on the metallic substrate 11 and in the photoelectric element fixing area A. The KSF phosphor based layer 14 is disposed on the multiple first photoelectric elements 13 and being not in contact with the metallic substrate 11. The KSF phosphor based layer 14 includes a KSF phosphor. The isolation layer 15 is disposed in the dam 12 and covering the KSF phosphor based layer 14.

The KSF phosphor based layer 14 may includes multiple KSF phosphor based structures 141 corresponding to the multiple first photoelectric elements 13 in one by one manner. Each the KSF phosphor based structure 141 covers the upper surface of the corresponding one first photoelectric element 13 facing away from the metallic substrate 11 and further extends from the upper surface to the side surface of the corresponding one first photoelectric element 13 to thereby cover the side surface of the corresponding one first photoelectric element 13.

The difference between the COB type photoelectric device 50 described in the illustrated embodiment and the COB type photoelectric device 20 described in the second embodiment is that in the COB type photoelectric device 50 described in the illustrated embodiment, the isolation layer 15 may include a first isolation layer 151 and a second isolation layer 152. The first isolation layer 151 is disposed on the metallic substrate 11 and filled between two adjacent first photoelectric elements 13, and the height of the first isolation layer 151 is not higher than the height of each of the multiple first photoelectric elements 13 in a direction perpendicular to the metallic substrate 11. The second isolation layer 152 is disposed covering the first isolation layer 151 and the multiple KSF phosphor based structures 141. As shown in FIG. 9, the height of the first isolation layer 151 is less than the height of each of the multiple the first photoelectric elements 13.

The first isolation layer 151 is for example a transparent isolation layer, including a transparent silicone. Alternatively, the first isolation layer 151 is for example a reflective layer, including a white reflective glue. Alternatively, the first isolation layer 151 is for example a phosphor glue layer, including a phosphor other than the KSF phosphor and a transparent glue material. The phosphor other than the KSF phosphor can be a monochrome phosphor or a mixed color phosphor. The monochrome phosphor is for example yellow phosphor or green phosphor, and the mixed color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin. Alternatively, the first isolation layer 151 is for example a substrate protective layer, which is generated by pretreatment of the metallic substrate, such as spraying protective paint, etc.

The second isolation layer 152 is for example a phosphor glue layer, including a phosphor other than the KSF phosphor and a transparent glue material. The phosphor other than the KSF phosphor can be a monochromatic phosphor or a mixed color phosphor. The monochromatic phosphor is for example yellow phosphor or green phosphor, and the mixed color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin. When the first isolation layer 151 is also a phosphor glue layer, the phosphor contained in the second isolation layer 152 may or may not be the same as the phosphor contained in the first isolation layer 151. The illustrated embodiment does not limit the material of the first isolation layer 151 and the types of other phosphor contained in the second isolation layer 152, which can be set according to actual needs. Of course, the illustrated embodiment does not limit that the second isolation layer 152 must contain phosphor. When the KSF phosphor based structure 141 contains not only the KSF phosphor but also other phosphor, the second isolation layer 152 may also be a transparent glue or a white diffusion glue containing diffusion powder.

Figure 10:
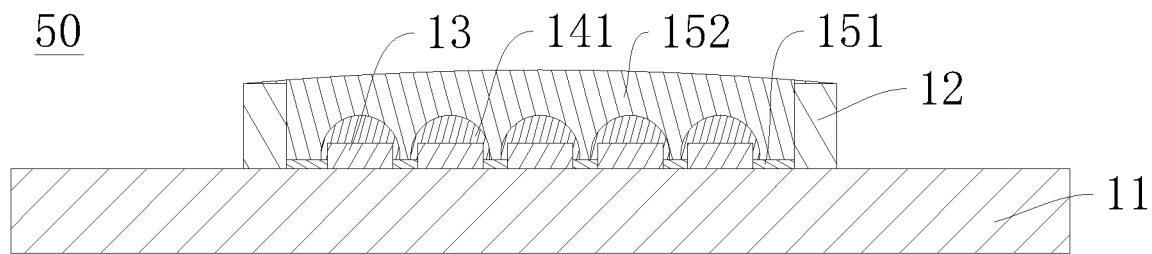
FIG. 10 is a schematic view of a partial structure of another COB type photoelectric device according to the fifth embodiment of the disclosure.

As in the second embodiment, as shown in FIG. 9, the multiple KSF phosphor based structures 14 may cover the upper surfaces of the multiple first photoelectric elements 13 with equal thicknesses and the side surfaces of the multiple first photoelectric elements 131 with equal thicknesses. Alternatively, as shown in FIG. 10, the multiple KSF phosphor based structures 14 may cover the upper surfaces of the multiple first photoelectric elements 13 with unequal thicknesses and the side surfaces of the multiple first photoelectric elements 13 with unequal thicknesses. For specific related description, please refer to the second embodiment, which will not be repeated here.

In summary, the COB type photoelectric device described in the fifth embodiment of the disclosure, the first isolation layer is disposed on the metallic substrate, the multiple KSF phosphor based structures containing the KSF phosphor on the multiple first photoelectric elements respectively, and the second isolation layer is disposed over the multiple KSF phosphor based structures and the first isolation layer, which can make full use of the high luminous efficiency performance of KSF, and improve the luminous efficiency of COB type light source while avoiding the KSF to be in contact with water and air to cause a reaction and to corrode of the metallic substrate in the COB type light source to thereby maintain stability of the KSF. In addition, the KSF phosphor based structure covers the upper surface of the corresponding first photoelectric element facing away from the metallic substrate and further extends from the upper surface to the side surface of the corresponding first photoelectric element to thereby cover the side surface of the corresponding first photoelectric element, which can reduce the probability of blue light leakage.

Sixth Embodiment

Figure 11:
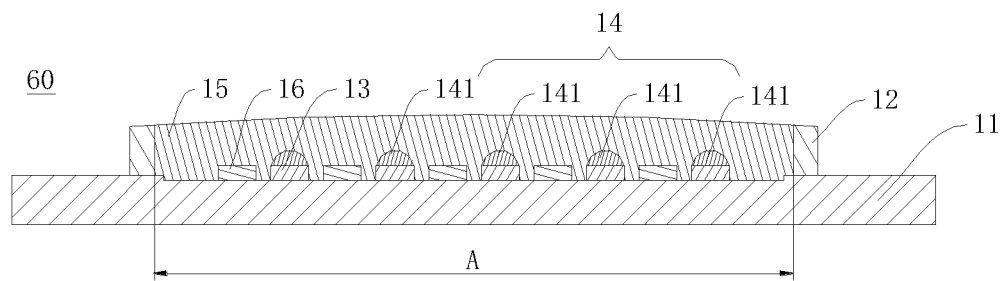
FIG. 11 is a schematic view of a partial structure of a COB type photoelectric device according to a sixth embodiment of the disclosure.
Figure 12:
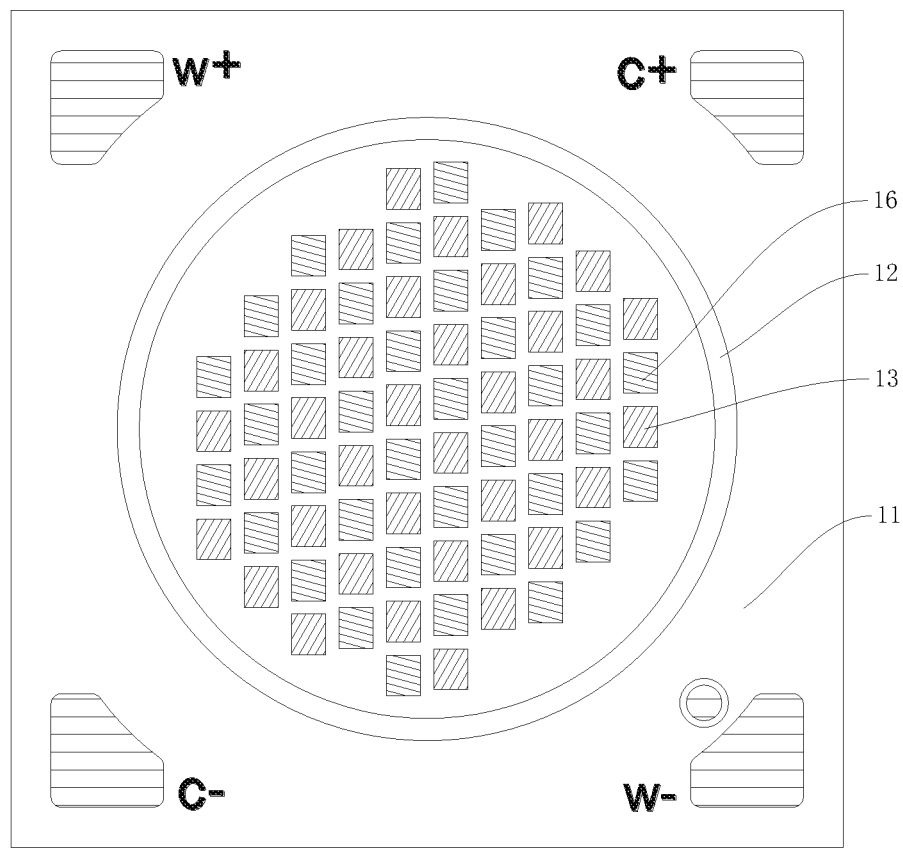
FIG. 12 is a schematic top view of a partial structure of the COB type photoelectric device shown in FIG. 11.

Referring to FIG. 11 and FIG. 12, the sixth embodiment of the disclosure provides a COB type photoelectric device. As shown in FIG. 11, the COB type photoelectric device 60 may include a metallic substrate 11, a dam 12, multiple first photoelectric elements 13, a KSF phosphor based layer 14 and an isolation layer 15.

The metallic substrate 11 may include a photoelectric element fixing area A. The dam 12 is disposed on the metallic substrate 11 and surrounding the photoelectric element fixing area A. The multiple first photoelectric elements 13 are disposed on the metallic substrate 11 and in the photoelectric element fixing area A. The KSF phosphor based layer 14 is disposed on the multiple first photoelectric elements 13 and being not in contact with the metallic substrate 11. The KSF phosphor based layer 14 includes a KSF phosphor. The isolation layer 15 is disposed in the dam 12 and covering the KSF phosphor based layer 14.

The difference between the COB type photoelectric device 60 described in the sixth embodiment and the COB type photoelectric device 10 described in the first embodiment is that the COB type photoelectric device 60 described in the illustrated embodiment is a dimming product, which may further include multiple second photoelectric elements 16 disposed on the metallic substrate 11 and in the photoelectric element fixing area A. The multiple second photoelectric elements 16 and the multiple first photoelectric elements 13 are arranged in a predetermined manner according to design requirements. The isolation layer 15 further covers multiple second photoelectric elements 16 and contains a phosphor other than the KSF phosphor. A color temperature of the light output by the phosphor contained in the isolation layer 15 after wavelength conversion of the light emitted from the multiple second photoelectric elements 16 is higher than a color temperature of the light output by the KSF phosphor based layer 14 after wavelength conversion of the light emitted from the multiple first photoelectric elements 13.

Specifically, the second photoelectric element 16 is for example a lateral-chip type photoelectric element or a flip-chip type photoelectric element. The first photoelectric element 13 and the second photoelectric element 16 may be the same or different. The number of the multiple first photoelectric elements 13 and the multiple second photoelectric elements 16 may be the same or different. The multiple second photoelectric elements 16 are for example multiple light-emitting diode chips, and the light-emitting diode chip is for example a blue light-emitting diode chip or a purple light-emitting diode chip. As shown in FIG. 12, the multiple first photoelectric elements 13 and the multiple second photoelectric elements 16 are for example arranged in a uniform cross arrangement according to the design requirements.

In addition, the COB type photoelectric device 60 may further include a first positive electrode and a first negative electrode connecting the multiple first photoelectric elements 13 and a second positive electrode and a second negative electrode connecting the multiple second photoelectric elements 16. As shown in FIG. 12, the first positive electrode W+, the second positive electrode C+, the first negative electrode W− and the second negative electrode C− may be arranged on the metallic substrate 11 around the photoelectric element fixing area A. For example, the four electrodes are integrally formed, such as a resin-based circuit layer. For example, the resin-based circuit layer a BT (Bismaleimide Triazine) resin-based circuit layer, or a ceramic-based circuit layer. The multiple first photoelectric elements 13 are electrically connected with the first positive electrode and the first negative electrode in a series, in a parallel, or in a series-parallel hybrid mode, and the multiple second photoelectric elements 16 are electrically connected with the second positive electrode and the second negative electrode in a series, in a parallel, or in a series-parallel hybrid mode.

Specifically, as shown in FIG. 11, the multiple first photoelectric elements 13 may be chips belonging to low color temperature strings, the surface of which is covered with the KSF phosphor based structure 141 containing the KSF phosphor to realize low color temperature luminescence, and the multiple second photoelectric elements 16 may be chips belonging to high color temperature strings, the surface of which is covered with isolation layer 15, such as high color temperature phosphor glue to realize high color temperature luminescence. The KSF phosphor based structure 141 is covered on the surfaces of the multiple first photoelectric elements 13, that is, the low color temperature phosphor glue is covered on the surfaces of the multiple first photoelectric elements 13, which is easy to control the consistency of the amount of phosphor glue and can improve the consistency of color temperature. The isolation layer 15 may be the high color temperature phosphor glue, which is evenly covered on the surfaces of the multiple KSF phosphor based structures 141 and the multiple second photoelectric elements 16, and it is also easy to control the consistency of color temperature.

The number and placement positions of the photoelectric elements included in the multiple first photoelectric elements 13 and the multiple second photoelectric elements 16 shown in FIG. 12 are only for a better understanding of the illustrated embodiment, and the illustrated embodiment is not limited thereto.

The difference between the isolation layer 15 according to the illustrated embodiment and the isolation layer 15 according to the first embodiment is that the isolation layer 15 according to the illustrated embodiment cannot be a transparent glue or a white diffusion glue containing diffusion powder, that is, the isolation layer 15 according to the illustrated embodiment is a phosphor glue layer, containing a phosphor other than the KSF phosphor and a transparent glue material. The phosphor other than the KSF phosphor may be a monochromatic phosphor or a mixed color phosphor. The monochromatic phosphor is for example yellow phosphor or green phosphor, and the mixed color phosphor is for example yellow-green phosphor, yellow-red phosphor, green-red phosphor, or yellow-green-red phosphor. The transparent glue material is for example epoxy resin, silicone, methyl silicone resin, phenyl silicone resin, methyl phenyl silicone resin, or modified silicone resin.

It is worth mentioning that the illustrated embodiment does not limit the KSF phosphor based structure 141, for example, the multiple KSF phosphor based structures 141 are covered on the upper surfaces of the multiple first photoelectric elements as shown in FIG. 11 and are dome-shaped in the direction perpendicular to the metallic substrate. Alternatively, the multiple KSF phosphor based structures 141 are for example the structures shown in FIG. 1 in the first embodiment, that is, the multiple KSF phosphor based structures 141 are rectangular-shaped in the direction perpendicular to the metallic substrate. Alternatively, the multiple KSF phosphor based structures 141 are for example the structures shown in FIG. 3 in the second embodiment, that is, the multiple KSF phosphor based structures 141 cover the upper surfaces and side surfaces of the multiple first photoelectric elements respectively, and the multiple KSF phosphor based structures 141 are disposed on the upper surfaces of the multiple first photoelectric elements with equal thicknesses and the side surfaces of the multiple first photoelectric elements with equal thicknesses. Alternatively, the multiple KSF phosphor based structures 141 are for example the structures shown in FIG. 4 in the second embodiment, that is, the multiple KSF phosphor based structures 141 cover the upper surfaces and side surfaces of the multiple first photoelectric elements, and the multiple KSF phosphor based structures 141 are disposed on the upper surfaces of the multiple first photoelectric elements with unequal thicknesses and the side surfaces of the multiple first photoelectric elements with unequal thicknesses.

In summary, the COB type photoelectric device described in the sixth embodiment of the disclosure, the KSF phosphor based layer containing the KSF phosphor is disposed on the multiple first photoelectric elements, and is not in contact with the metallic substrate, and the isolation layer is disposed over the KSF phosphor based layer, which can make full use of the high luminous efficiency performance of KSF, and improve the luminous efficiency of COB type light source while avoiding the KSF to be in contact with water and air to cause a reaction and to corrode of the metallic substrate in the COB type light source to thereby maintain stability of the KSF. Further, the multiple second photoelectric elements are disposed in the photoelectric element fixing area, and the isolation layer contains the phosphor other than the KSF phosphor to cover the multiple second photoelectric elements, which can realize dimming and color adjustment function of the COB type light source.

Seventh Embodiment

Figure 13:
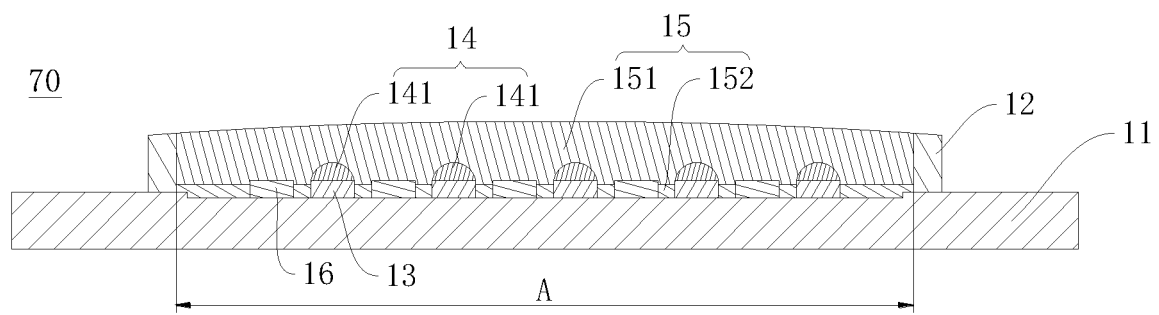
FIG. 13 is a schematic view of a partial structure of a COB type photoelectric device according to a seventh embodiment of the disclosure.

Referring to FIG. 13, the seventh embodiment of the disclosure provides a COB type photoelectric device. As shown in FIG. 13, the COB type photoelectric device 70 may include a metallic substrate 11, a dam 12, multiple first photoelectric elements 13, a KSF phosphor based layer 14 and an isolation layer 15.

The metallic substrate 11 may include a photoelectric element fixing area A. The dam 12 is disposed on the metallic substrate 11 and surrounding the photoelectric element fixing area A. The multiple first photoelectric elements 13 are disposed on the metallic substrate 11 and in the photoelectric element fixing area A. FIG. 13 illustrates five first photoelectric elements 13, but the disclosure is not limited thereto. The KSF phosphor based layer 14 is disposed on the multiple first photoelectric elements 13 and being not in contact with the metallic substrate 11. The KSF phosphor based layer 14 includes a KSF phosphor. The isolation layer 15 is disposed in the dam 12 and covering the KSF phosphor based layer 14.

For example, the KSF phosphor based layer 14 may include multiple KSF phosphor based structures 141 corresponding to the multiple first photoelectric elements 13 in one by one manner. Five KSF phosphor based structures 141 are shown in the FIG. 13, but only two KSF phosphor based structures 141 are marked due to space constraints in the FIG. 13.

The isolation layer 15 may include a first isolation layer 151 disposed on the metallic substrate 11, and a height of the first isolation layer 151 is not higher than a height of each of the multiple first photoelectric elements 13 in a direction perpendicular to the metallic substrate 11. The second isolation layer 152 is disposed over the KSF phosphor based layer 14.

The difference between the COB type photoelectric device 70 described in the illustrated embodiment and the COB type photoelectric device 40 described in the fourth embodiment is that the COB type photoelectric device 70 described in the illustrated embodiment may further include multiple second photoelectric elements 16 disposed on the metallic substrate 11 and in the photoelectric element fixing area A. The multiple second photoelectric elements 16 and the multiple first photoelectric elements 13 are arranged in a predetermined manner according to design requirements, for example, arranged at intervals.

The first isolation layer 151 is filled between each of the multiple first photoelectric elements 13 and the second photoelectric element 16 adjacent to the first photoelectric element 13, and the height of the first isolation layer 151 is not higher than a height of each of the multiple second photoelectric elements 16 in the direction perpendicular to the metallic substrate 11. The second isolation layer 152 is also disposed on the first isolation layer 151 and the multiple second photoelectric elements 16, and contains a phosphor other than the KSF phosphor. A color temperature of light output by the phosphor contained in the second isolation layer 152 after wavelength conversion of light emitted from the multiple second photoelectric elements 16 is higher than a color temperature of light output by the KSF phosphor based layer after wavelength conversion of light emitted from the multiple first photoelectric elements 13.

Specifically, the second photoelectric element 16 is for example a lateral-chip type photoelectric element or a flip-chip type photoelectric element. The first photoelectric element 13 and the second photoelectric element 16 may be the same or different. The number of the multiple first photoelectric elements 13 and the multiple second photoelectric elements 16 may be the same or different. The multiple second photoelectric elements 16 are for example multiple light-emitting diode chips, and the light-emitting diode chip is for example a blue light-emitting diode chip or a purple light-emitting diode chip. The multiple first photoelectric elements 13 and the multiple second photoelectric elements 16 are arranged according to the design requirements, for example, in a uniform cross arrangement.

In addition, the COB type photoelectric device 70 may further include a first positive electrode and a first negative electrode connecting the multiple first photoelectric elements 13 and a second positive electrode and a second negative electrode connecting the multiple second photoelectric elements 16. For example, the first positive electrode, the second positive electrode, the first negative electrode and the second negative electrode are disposed on the metallic substrate 11 around the photoelectric element fixing area A. For example, the four electrodes are integrally formed, such as a resin-based circuit layer. For example, the resin-based circuit layer is a BT (Bismaleimide triazine) resin-based circuit layer, or a ceramic-based circuit layer. The multiple first photoelectric elements 13 are electrically connected with the first positive electrode and the first negative electrode in a series, in a parallel, or in a series-parallel hybrid mode, and the multiple second photoelectric elements 16 are electrically connected with the second positive electrode and the second negative electrode in a series, in a parallel, or in a series-parallel hybrid mode.

For example, the multiple first photoelectric elements 13 are chips belonging to low color temperature strings, the surfaces of which are covered with the multiple KSF phosphor based structures 141 containing the KSF phosphor to realize low color temperature luminescence, and the multiple second photoelectric elements 16 are chips belonging to high color temperature strings, for example, the surfaces of which are covered with a second isolation layer 152, such as a high color temperature phosphor glue to realize high color temperature luminescence. The multiple KSF phosphor based structures 141 are covered on the surfaces of the multiple first photoelectric elements 13, that is, the low color temperature phosphor glue is covered on the surfaces of the multiple first photoelectric elements 13, which is easy to control the consistency of the amount of phosphor glue and can improve the consistency of color temperature. The second isolation layer 15 may be the high color temperature phosphor glue, which is evenly covered on the surfaces of the multiple KSF phosphor based structures 141 and the multiple second photoelectric elements 16, and it is also easy to control the consistency of color temperature.

The difference between the second isolation layer 152 according to the illustrated embodiment and the second isolation layer 152 according to the fourth embodiment is that the second isolation layer 152 according to the illustrated embodiment cannot be a transparent glue or a white diffusion glue containing diffusion powder, that is, the second isolation layer 152 according to the illustrated embodiment is a phosphor glue layer, containing a phosphor other than KSF phosphor and a transparent glue material. The phosphor other than the KSF phosphor may be a monochromatic phosphor or a mixed color phosphor. The monochromatic phosphor is for example yellow phosphor or green phosphor, and the mixed color phosphor is for example yellow-green phosphor, yellow-red phosphor, green-red phosphor, or yellow-green-red phosphor. The transparent glue material is for example, epoxy resin, silicone, methyl silicone resin, phenyl silicone resin, methyl phenyl silicone resin, or modified silicone resin.

It is worth mentioning that the illustrated embodiment does not limit the KSF phosphor based structure 141, for example, the multiple KSF phosphor based structures 141 are covered on the upper surfaces of the multiple first photoelectric elements as shown in FIG. 13 and are dome-shaped in the direction perpendicular to the metallic substrate. Alternatively, the multiple KSF phosphor based structures 141 are for example the structures shown in FIG. 1 in the first embodiment, that is, the multiple KSF phosphor based structures 141 are rectangular-shaped in the direction perpendicular to the metallic substrate. Alternatively, the multiple KSF phosphor based structures 141 are for example the structures shown in FIG. 3 in the second embodiment, that is, the multiple KSF phosphor based structures 141 cover the upper surfaces and side surfaces of the multiple first photoelectric elements, and the multiple KSF phosphor based structures 141 are disposed on the upper surfaces of the multiple first photoelectric elements with equal thicknesses and the side surfaces of the multiple first photoelectric elements with equal thicknesses. Alternatively, the multiple KSF phosphor based structures 141 are for example the structures shown in FIG. 4 in the second embodiment, that is, the multiple KSF phosphor based structures 141 cover the upper surfaces and side surfaces of the multiple first photoelectric elements, and the multiple KSF phosphor based structures 141 are disposed on the upper surfaces of the multiple first photoelectric elements with unequal thicknesses and on the side surfaces of the multiple first photoelectric elements with unequal thicknesses.

In summary, the COB type photoelectric device described in the embodiment of the disclosure, the first isolation layer is disposed on the metallic substrate, the multiple KSF phosphor based structures containing the KSF phosphor are disposed on the multiple first photoelectric elements, and are not in contact with the metallic substrate, the second isolation layer is disposed over the multiple KSF phosphor based structures and the multiple second photoelectric elements, which can make full use of the high luminous efficiency performance of KSF, improve the luminous efficiency of COB type light source while avoiding the KSF to be in contact with water and air to cause a reaction and to corrode of the metallic substrate in the COB type light source to thereby maintain stability of the KSF, and realize dimming and color adjustment functions of the COB type light source.

Finally, it should be noted that the above embodiments are only used to illustrate the technical solution of the disclosure, not to limit it. Although the disclosure has been described in detail with reference to the illustrated embodiments, those skilled in the art should understand that they can still modify the technical solutions recorded in the illustrated embodiments or replace some of the technical features equally. These modifications or substitutions do not separate the essence of the corresponding technical solution from the spirit and scope of the technical solution of each embodiment of the disclosure.

What is claimed is:

1. A chip-on-board (COB) type photoelectric device, comprising:
a metallic substrate, comprising: a photoelectric element fixing area;
a dam, disposed on the metallic substrate and surrounding the photoelectric element fixing area;
a plurality of first photoelectric elements, disposed on the metallic substrate and in the photoelectric element fixing area;
a KSF phosphor based layer, disposed on the plurality of first photoelectric elements and being not in contact with the metallic substrate, wherein the KSF phosphor based layer comprises a KSF phosphor; and
an isolation layer, disposed in the dam and covering the KSF phosphor based layer; wherein the isolation layer comprises:
a first isolation layer, disposed on the metallic substrate, and a height of the first isolation layer in a direction perpendicular to the metallic substrate is not higher than a height of each of the plurality of first photoelectric elements in the direction perpendicular to the metallic substrate; and
a second isolation layer, disposed over the KSF phosphor based layer.

2. The COB type photoelectric device according to claim 1, wherein the KSF phosphor based layer comprises a plurality of KSF phosphor based structures corresponding to the plurality of first photoelectric elements, each of the plurality of KSF phosphor based structures covers an upper surface of a corresponding one of the plurality of first photoelectric elements facing away from the metallic substrate;
wherein each of the plurality of KSF phosphor based structures comprises the KSF phosphor.

3. The COB type photoelectric device according to claim 2, wherein a cross-section of any one of the plurality of KSF phosphor based structures in a direction perpendicular to the metallic substrate is rectangular-shaped or dome-shaped.

4. The COB type photoelectric device according to claim 1, wherein the KSF phosphor based layer comprises a plurality of KSF phosphor based structures corresponding to the plurality of first photoelectric elements, each of the plurality of KSF phosphor based structures covers an upper surface of a corresponding one of the plurality of first photoelectric elements facing away from the metallic substrate,
 wherein each of the plurality of KSF phosphor based structures comprises the KSF phosphor;
 wherein the second isolation layer is disposed over the first isolation layer and the plurality of KSF phosphor based structures.

5. The COB type photoelectric device according to claim 1, wherein the KSF phosphor based layer comprises a plurality of KSF phosphor based structures corresponding to the plurality of first photoelectric elements, and each of the plurality of KSF phosphor based structures covers an upper surface of a corresponding one of the plurality of first photoelectric elements facing away from the metallic substrate and further extends from the upper surface to a side surface of the corresponding one first photoelectric element to thereby cover the side surface of the corresponding one first photoelectric element;
 wherein each of the plurality of KSF phosphor based structures comprises the KSF phosphor;
 wherein the second isolation layer is disposed over the first isolation layer and the plurality of KSF phosphor based structures.

6. The COB type photoelectric device according to claim 1, wherein the height of the first isolation layer is the same as the height of each of the plurality of first photoelectric elements, and the KSF phosphor based layer covers the first isolation layer and the plurality of first photoelectric elements.

7. The COB type photoelectric device according to claim 1, wherein the height of the first isolation layer is less than the height of each of the plurality of first photoelectric elements, the KSF phosphor based layer covers the first isolation layer and the plurality of first photoelectric elements, a height of the KSF phosphor based layer covering the first isolation layer is greater than that of the KSF phosphor based layer covering the first photoelectric element, and an upper surface of the KSF phosphor based layer facing away from the metallic substrate is a horizontal plane.

8. The COB type photoelectric device according to claim 2, further comprising:
 a plurality of second photoelectric elements, disposed on the metallic substrate and in the photoelectric element fixing area;
 wherein the plurality of second photoelectric elements and the plurality of first photoelectric elements are arranged in a predetermined manner;
 wherein the isolation layer further covers the plurality of second photoelectric elements and contains a phosphor other than the KSF phosphor; a color temperature of light output by the phosphor contained in the isolation layer after wavelength conversion of light emitted from the plurality of second photoelectric elements is higher than a color temperature of light output by the KSF phosphor based layer after wavelength conversion of light emitted from the plurality of first photoelectric elements.

9. The COB type photoelectric device according to claim 3, further comprising:
 a plurality of second photoelectric elements, disposed on the metallic substrate and in the photoelectric element fixing area;
 wherein the plurality of second photoelectric elements and the plurality of first photoelectric elements are arranged in a predetermined manner;
 wherein the isolation layer further covers the plurality of second photoelectric elements and contains a phosphor other than the KSF phosphor; a color temperature of light output by the phosphor contained in the isolation layer after wavelength conversion of light emitted from the plurality of second photoelectric elements is higher than a color temperature of light output by the KSF phosphor based layer after wavelength conversion of light emitted from the plurality of first photoelectric elements.

10. The COB type photoelectric device according to claim 1, further comprising:
 a plurality of second photoelectric elements, disposed on the metallic substrate and in the photoelectric element fixing area;
 wherein the plurality of second photoelectric elements and the plurality of first photoelectric elements are arranged in a predetermined manner;
 wherein the first isolation layer is filled between each of the plurality of first photoelectric elements and the second photoelectric element adjacent to the first photoelectric element; and in a direction perpendicular to the metallic substrate, the height of the first isolation layer is not higher than a height of each of the plurality of second photoelectric elements;
 wherein the second isolation layer is disposed over the first isolation layer and the plurality of second photoelectric elements, and the second isolation layer contains a phosphor other than the KSF phosphor; a color temperature of light output by the phosphor contained in the second isolation layer after wavelength conversion of light emitted from the plurality of second photoelectric elements is higher than a color temperature of light output by the KSF phosphor based layer after wavelength conversion of light emitted from the plurality of first photoelectric elements.

11. The COB type photoelectric device according to claim 4, further comprising:
 a plurality of second photoelectric elements, disposed on the metallic substrate and in the photoelectric element fixing area;
 wherein the plurality of second photoelectric elements and the plurality of first photoelectric elements are arranged in a predetermined manner;
 wherein the first isolation layer is filled between each of the plurality of first photoelectric elements and the second photoelectric element adjacent to the first photoelectric element; and in a direction perpendicular to the metallic substrate, the height of the first isolation layer is not higher than a height of each of the plurality of second photoelectric elements;
 wherein the second isolation layer is disposed over the first isolation layer and the plurality of second photoelectric elements, and the second isolation layer contains a phosphor other than the KSF phosphor; a color temperature of light output by the phosphor contained in the second isolation layer after wavelength conversion of light emitted from the plurality of second photoelectric elements is higher than a color temperature of light output by the KSF phosphor based layer after wavelength conversion of light emitted from the plurality of first photoelectric elements.

12. The COB type photoelectric device according to claim 5, further comprising:
a plurality of second photoelectric elements, disposed on the metallic substrate and in the photoelectric element fixing area;
wherein the plurality of second photoelectric elements and the plurality of first photoelectric elements are arranged in a predetermined manner;
wherein the first isolation layer is filled between each of the plurality of first photoelectric elements and the second photoelectric element adjacent to the first photoelectric element; and in a direction perpendicular to the metallic substrate, the height of the first isolation layer is not higher than a height of each of the plurality of second photoelectric elements;
wherein the second isolation layer is disposed over the first isolation layer and the plurality of second photoelectric elements, and the second isolation layer contains a phosphor other than the KSF phosphor; a color temperature of light output by the phosphor contained in the second isolation layer after wavelength conversion of light emitted from the plurality of second photoelectric elements is higher than a color temperature of light output by the KSF phosphor based layer after wavelength conversion of light emitted from the plurality of first photoelectric elements.

13. A photoelectric device, comprising:
a metallic substrate, comprising: a bonding area;
a dam, disposed on the metallic substrate and surrounding the bonding area;
a plurality of photoelectric elements, disposed on the metallic substrate and in the bonding area;
a fluoride red-light phosphor, disposed over the plurality of first photoelectric elements and being spaced from the metallic substrate; and
an isolation layer, disposed in the dam and covering the fluoride red-light phosphor as well as between the fluoride red-light phosphor and the metallic substrate;
wherein the isolation layer comprises a first isolation layer and a second isolation layer, the first isolation layer is disposed between the fluoride red-light phosphor and the metallic substrate as well as between the second isolation layer and the metallic substrate, and the second isolation layer is disposed covering the fluoride red-light phosphor.

14. A COB type photoelectric device, comprising:
a metallic substrate, comprising: a photoelectric element fixing area;
a dam, disposed on the metallic substrate and surrounding the photoelectric element fixing area;
a plurality of first photoelectric elements, disposed on the metallic substrate and in the photoelectric element fixing area;
a KSF phosphor based layer, disposed on the plurality of first photoelectric elements and being not in contact with the metallic substrate, wherein the KSF phosphor based layer comprises a KSF phosphor; and
an isolation layer, disposed in the dam and covering the KSF phosphor based layer;
wherein the KSF phosphor based layer comprises a plurality of KSF phosphor based structures corresponding to the plurality of first photoelectric elements, each of the plurality of KSF phosphor based structures covers an upper surface of a corresponding one of the plurality of first photoelectric elements facing away from the metallic substrate and further extends from the upper surface to a side surface of the corresponding one first photoelectric element to thereby cover the side surface of the corresponding one first photoelectric element; and
wherein the isolation layer is filled between each of the plurality of KSF phosphor based structures and the metallic substrate.

* * * * *